United States Patent
Chang et al.

(10) Patent No.: US 9,443,965 B2
(45) Date of Patent: Sep. 13, 2016

(54) METHOD FOR PRODUCING A THIN FILM TRANSISTOR

(71) Applicant: NATIONAL SUN YAT-SEN UNIVERSITY, Kaohsiung (TW)

(72) Inventors: Ting-Chang Chang, Kaohsiung (TW); Hua-Mao Chen, Kaohsiung (TW); Ming-Yen Tsai, Kaohsiung (TW); Tian-Yu Hsieh, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/570,622

(22) Filed: Dec. 15, 2014

(65) Prior Publication Data

US 2016/0155827 A1    Jun. 2, 2016

(30) Foreign Application Priority Data

Dec. 2, 2014 (TW) .............................. 103141854 A

(51) Int. Cl.
| | |
|---|---|
| H01L 21/46 | (2006.01) |
| H01L 21/441 | (2006.01) |
| H01L 29/66 | (2006.01) |
| H01L 29/786 | (2006.01) |
| H01L 29/22 | (2006.01) |
| H01L 21/02 | (2006.01) |
| H01L 29/49 | (2006.01) |
| H01L 29/423 | (2006.01) |
| H01L 29/417 | (2006.01) |

(52) U.S. Cl.
CPC ... *H01L 29/66969* (2013.01); *H01L 21/02554* (2013.01); *H01L 21/441* (2013.01); *H01L 21/46* (2013.01); *H01L 29/22* (2013.01); *H01L 29/41733* (2013.01); *H01L 29/42356* (2013.01); *H01L 29/42384* (2013.01); *H01L 29/4908* (2013.01); *H01L 29/4966* (2013.01); *H01L 29/7869* (2013.01); *H01L 29/78603* (2013.01)

(58) Field of Classification Search
None
See application file for complete search history.

(56) References Cited

U.S. PATENT DOCUMENTS

| | | | |
|---|---|---|---|
| 5,900,646 A * | 5/1999 | Takizawa et al. | 257/57 |
| 8,455,310 B2 | 6/2013 | Yim | |
| 2011/0177696 A1 * | 7/2011 | Yano et al. | 438/779 |
| 2013/0146452 A1 * | 6/2013 | Yano et al. | 204/298.13 |

FOREIGN PATENT DOCUMENTS

TW    I431781    3/2014

* cited by examiner

*Primary Examiner* — Asok K Sarkar
(74) *Attorney, Agent, or Firm* — Muncy, Geissler, Olds & Lowe, P.C.

(57) ABSTRACT

A method for producing a thin film transistor includes forming a transistor prototype on a substrate. The transistor prototype includes two transparent electrodes adapted to form a source and a drain of a thin film transistor. Next, the two transparent electrodes of the transistor prototype are exposed in an environment full of a plasma. The plasma conducts a surface treatment on the two transparent electrodes of the transistor prototype to form the thin film transistor. The method can solve the problem of excessive contact resistance of the transparent conductive films of conventional thin film transistors.

14 Claims, 6 Drawing Sheets

METHOD FOR PRODUCING A THIN FILM TRANSISTOR

BACKGROUND OF THE INVENTION

1. Field of the Invention

The present invention relates to a method for producing a thin film transistor and, more particularly, to a method for producing a thin film transistor having a transparent conducting film.

2. Description of the Related Art

Due to progress of the semiconductor technology, thin film transistors (TFTs) have gradually been developed as electronic switches and have widely been used in various electronic devices. Taking a flat display as an example, amorphous/poly silicon semiconductor can be used as an active layer of a thin film transistor so as to use the thin film transistor as a charging/discharging switch element for a charge storage capacitor for controlling pixels.

The electrodes of conventional thin film transistors are generally made of metal, an example of which is disclosed in Taiwan Patent No. 1431781 entitled "METHOD FOR PRODUCING THIN FILM TRANSISTOR ELEMENT". The metal material used in conventional thin film transistors is not transparent. However, the metal electrodes of conventional thin film transistors must be changed into transparent conductive films for the purposes of development of fully transparent displays.

However, using the transparent conductive films in thin film transistors in display devices encounters the problem of excessively large resistance between the transparent conductive films and other material layers, leading to a drop in the conduction current ($I_{ON}$) in the transistors as well as a current crowding effect (indicated by the area D1 in FIG. 1).

Thus, it is necessary to solve the above drawbacks in the prior art to meet practical needs, thereby increasing the utility.

SUMMARY OF THE INVENTION

An objective of the present invention is to provide a method for producing a thin film transistor to reduce the contact resistance between the transparent conductive films and other material layers.

A method for producing a thin film transistor according to the present invention includes forming a transistor prototype on a substrate. The transistor prototype includes two transparent electrodes adapted to form a source and a drain of a thin film transistor. Next, the two transparent electrodes of the transistor prototype are exposed in an environment full of a plasma. The plasma conducts a surface treatment on the two transparent electrodes of the transistor prototype to form the thin film transistor.

The two transparent electrodes can be made of indium tin oxide.

The plasma can be hydrogen plasma.

The biasing power of the hydrogen plasma can be 200-400 W.

The operating pressure of the hydrogen plasma can be 15 mTorr.

The surface treatment by the hydrogen plasma can be conducted for 20-100 seconds.

The plasma power of the hydrogen plasma can be 500-700 W.

The plasma flow rate of the hydrogen plasma can be 20-30 sccm.

In a first example, forming the transistor prototype includes forming a gate on the substrate, forming a gate insulator on the gate and the substrate, and forming the two transparent electrodes on the gate insulator.

In the first example, an active layer region can be formed between the two transparent electrodes to form the thin film transistor after the surface treatment of the two transparent electrodes of the transistor prototype.

In a second example, forming the transistor prototype includes forming the two transparent electrodes on the substrate.

In the second example, the thin film transistor is produced after surface treatment of the two transparent electrodes of the transistor prototype. The thin film transistor is produced by forming an active layer region between the two transparent electrodes, forming a gate insulator on the two transparent electrodes, the active layer region, and the substrate, and forming a gate on the gate insulator.

The gate can be made of indium tin oxide.

The gate insulator can be made of silicon dioxide.

The active layer region can be made of zinc oxide.

The thin film transistor can have a coplanar or inverted coplanar structure.

The substrate can be a flexible substrate, a glass substrate, a metal substrate, or a plastic substrate.

In the method for producing a thin film transistor, a transistor prototype is formed on a substrate and includes two transparent electrodes for forming a source and a drain of a thin film transistor. Next, the two transparent electrodes of the transistor prototype are exposed in an environment full of a plasma that conducts a surface treatment on the two transparent electrodes of the transistor prototype to form the thin film transistor. Thus, the surfaces of the transparent electrodes are metalized to be more like a conductor. This reduces the contact resistance between the two transparent electrodes and other material layers, achieving the effects of increasing the conduction current of the thin film transistor and avoiding the current crowding effect.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

DETAILED DESCRIPTION OF THE INVENTION

The term "plasma" (or "plasma state") referred to herein means a state of a substance whose main component is free electrons and charged ions, and the state of the substance is other than the solid, liquid, and gaseous states, which can be appreciated by one having ordinary skill in the art.

The term "lift-off process" referred to herein means a process using techniques, such as coating photoresist, masking, exposure, development, depositing metal, and removing photoresist, to leave a desired metal (circuit) pattern, which is usually used in patterns difficult to be obtained by etching, which can be appreciated by one having ordinary skill in the art. The lift-off process is used as a non-restrictive example in the method according to the present invention.

Figure 2:
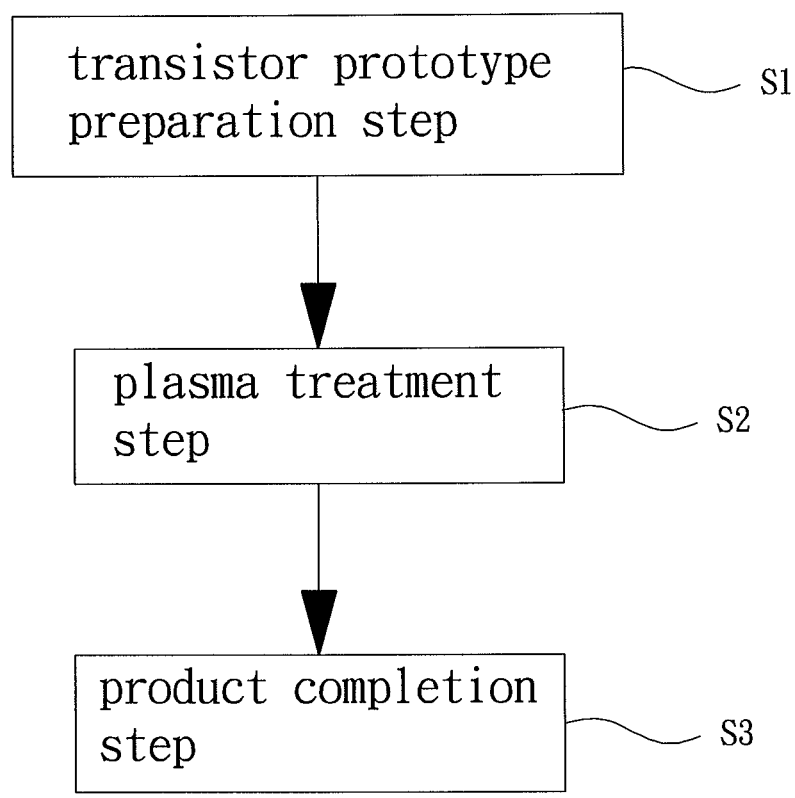
FIG. 2 is a block diagram of a method for producing a thin film transistor according to the present invention.
Figure 3:
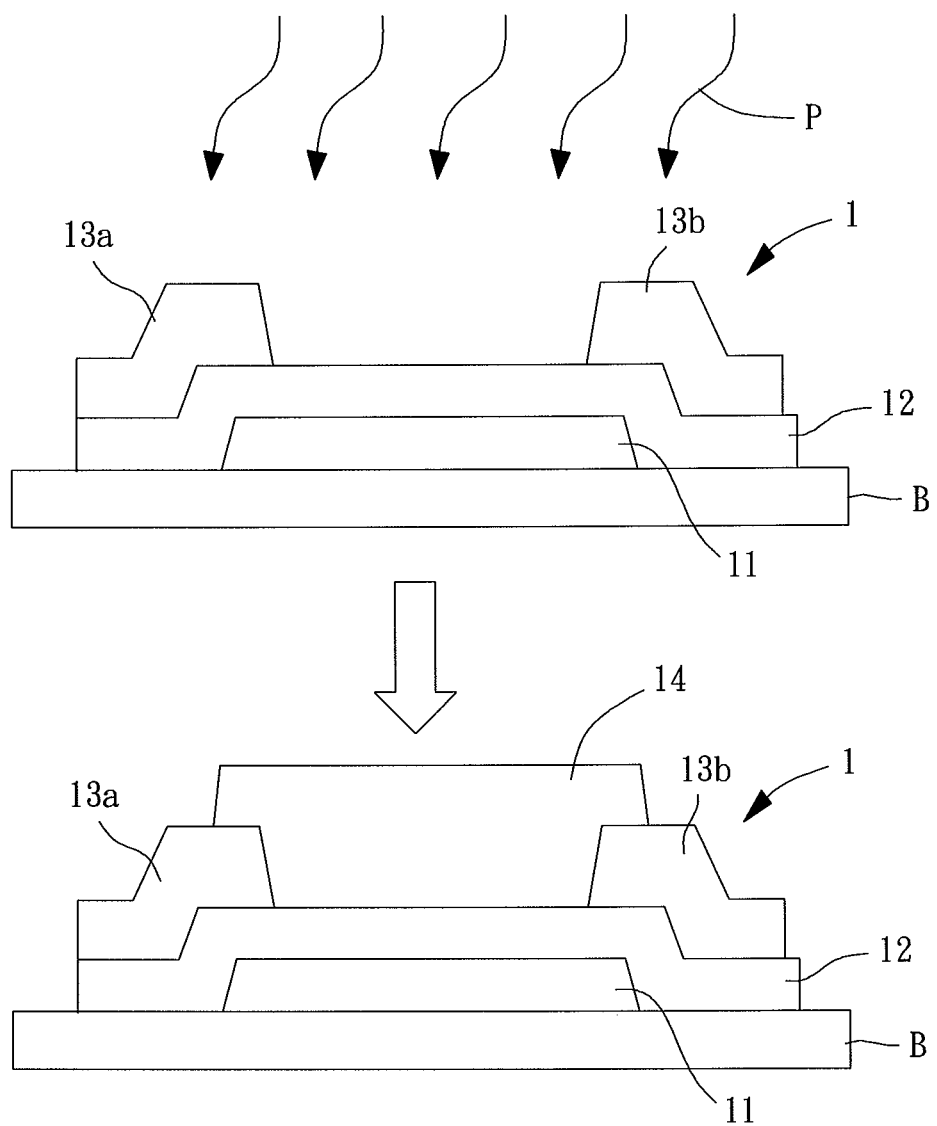
FIG. 3 is a diagrammatic view illustrating a method for producing a thin film transistor of a first embodiment according to the present invention.

FIG. 2 is a block diagram of a method for producing a thin film transistor according to the present invention. An embodiment of the method includes a transistor prototype preparation step S1, a plasma treatment step S2, and a product completion step S3. The structure of the thin film transistor produced by the embodiment of the method for producing a thin film transistor according to the present invention can be coplanar or inverted coplanar. FIG. 3 is a diagrammatic view illustrating a method for producing a thin film transistor of a first embodiment according to the present invention. In this embodiment, the thin film transistor has an inverted coplanar structure.

Specifically, in the transistor prototype preparation step S1 a transistor prototype 1 is formed on a substrate B. The transistor prototype 1 includes two transparent electrodes 13a and 13b. The two transparent electrodes 13a and 13b are adapted to form a source and a drain of a thin film transistor. In this embodiment, the substrate B for forming the transistor prototype 1 can be a flexible substrate, a glass substrate, a metal substrate, or a plastic substrate. An example of forming the transistor prototype 1 includes forming a transparent conductive film on the substrate B by deposition to form a gate 11. The transparent conductive film can be made of a transparent conductive material, such as indium tin oxide (ITO), aluminum zinc oxide (AZO), indium zinc oxide (IZO), or gallium-doped zinc oxide (GZO). Next, a gate insulator 12 is formed on the gate 11 and the substrate B by deposition. The gate insulator 12 is made of an insulating material, such as silicon dioxide ($SiO_2$) or silicon nitride ($Si_3N_4$). Then, another transparent conductive film is formed on the gate insulator 12 by deposition to permit subsequent formation of the two transparent electrodes 13a, 13b by etching. The two transparent electrodes 13a, 13b serve as the drain and the source.

With reference to FIGS. 2 and 3, in the plasma treatment step S2 the two transparent electrodes 13a and 13b of the transistor prototype 1 are exposed in an environment full of a plasma P. The plasma P conducts a surface treatment on the two transparent electrodes 13a and 13b of the transistor prototype 1 to form the thin film transistor having an inverted coplanar structure. In this embodiment, the transistor prototype 1 is placed in a reaction chamber (not shown), and the plasma (such as hydrogen plasma) is filled into the reaction chamber. The plasma flow rate of the plasma P is 20-30 sccm (standard cubic centimeter per minute, in which the gas flow rate is 1 $cm^3$/min in the standard state at 273K and 760 torr). The plasma power of the plasma P is 500-700 W. The surface treatment by the plasma P is conducted for 20-100 seconds. The biasing power of the plasma P is 200-400 W. The operating pressure of the plasma P is 10-30 mTorr. When the indium tin oxide in the two transparent electrodes 13a, 13b contacts with hydrogen in the plasma P, hydrogen competes with tin (Sn) in the indium tin oxide for the oxygen bond (O bond) to form a hydroxyl bond (OH bond) and releases an electron, as shown by the following equation:

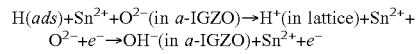

The surfaces of the two transparent electrodes 13a and 13b are metalized and become more like a conductor. This reduces the contact resistance between the two transparent electrodes 13a and 13b and other material layers.

Still referring to FIGS. 2 and 3, in the product completion step S3 the thin film transistor is produced from the transistor prototype 1 that has been processed by the surface treatment with the plasma P. In this embodiment, after the surface treatment of the two transparent electrodes 13a and 13b of the transistor prototype 1 by the plasma P, an active layer material is formed between the two transparent electrodes 13a and 13b by deposition. The active layer material can be zinc oxide (ZnO). Then, an active layer region 14 can be defined by the lift-off process. Thus, a thin film transistor of an inverted coplanar structure is finished.

Note that Schottky contact is less likely to occur at the contact surfaces between the active layer region 14 and the two transparent electrodes 13a and 13b. Furthermore, the characteristics of the contact surfaces are more like ohmic contact. Since the contact resistance between the active layer region 14 and the two transparent electrodes 13a and 13b is reduced, the conduction current of the thin film transistor can be increased to avoid the current crowding effect, which can be appreciated by one having ordinary skill in the art.

Figure 1:
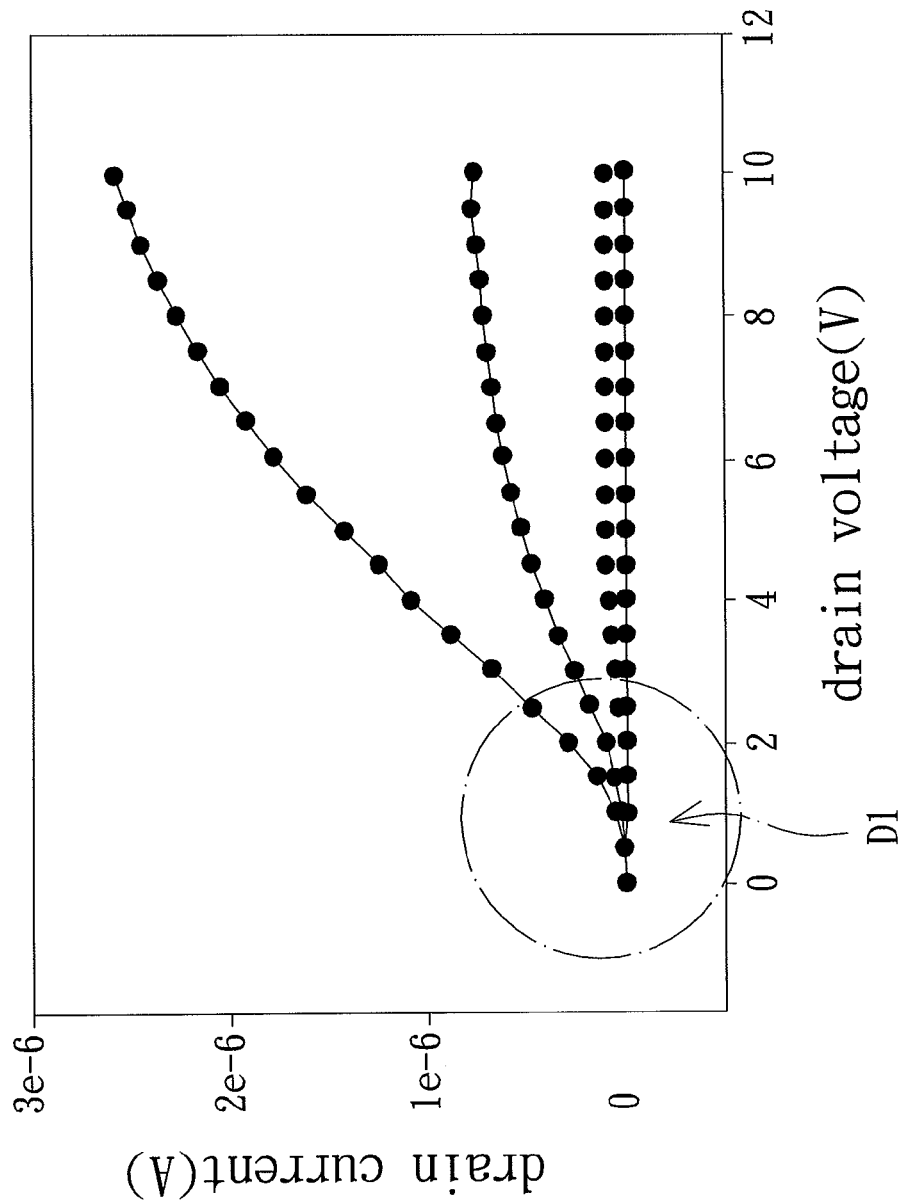
FIG. 1 is a diagram of drain current-drain voltage curves of conventional thin film transistors.
Figure 4:
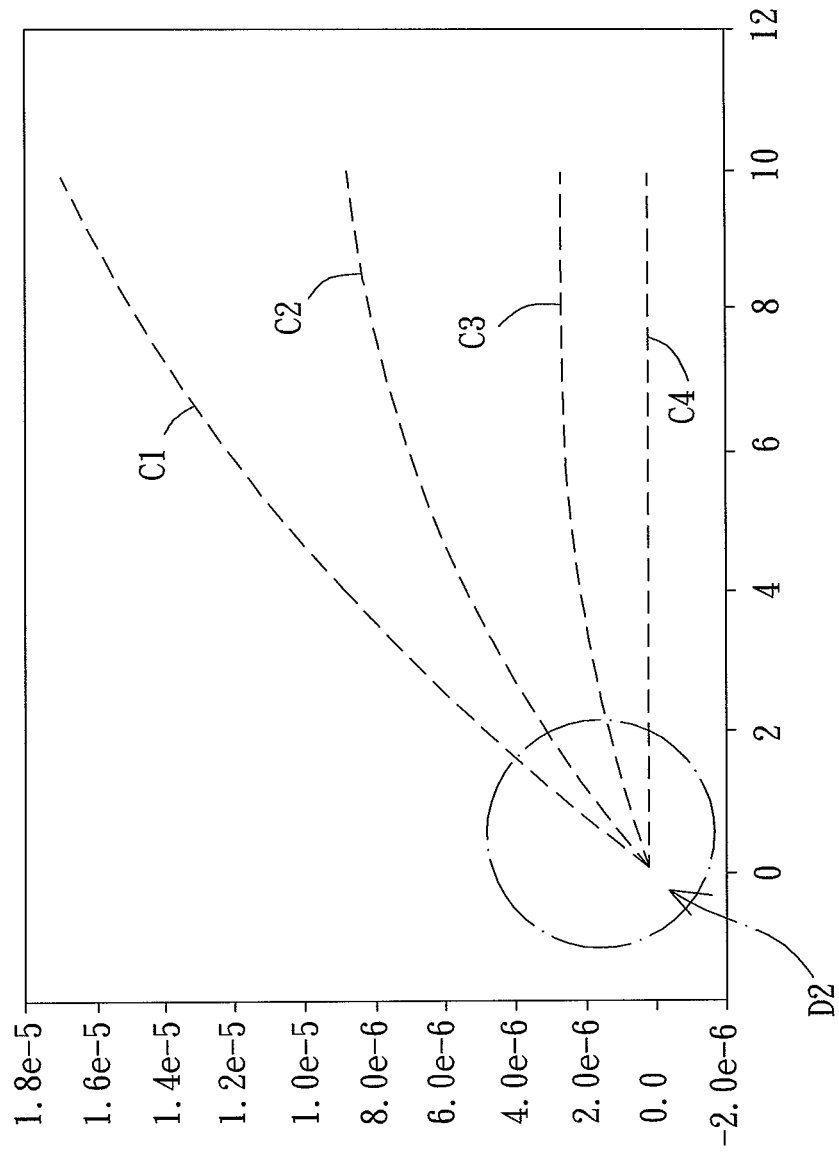
FIG. 4 is a diagram of drain current-drain voltage curves of thin film transistors produced by the method of the first embodiment according to the present invention.

FIG. 4 is a diagram of drain current-drain voltage curves of thin film transistors produced by the method of the first embodiment according to the present invention. The different drain current-drain voltage curves C1-C4 of the thin film transistors subjected to the plasma treatment of the method of the first embodiment according to the present invention are distinct from each other (see the area D2 in FIG. 4). In comparison with the drain current-drain voltage curves (see the area D1 in FIG. 1) of the conventional thin film transistors troubled by the current crowding effect, the thin film transistors produced by the method of the first embodiment according to the present invention can indeed avoid the current crowding effect.

Figure 5:
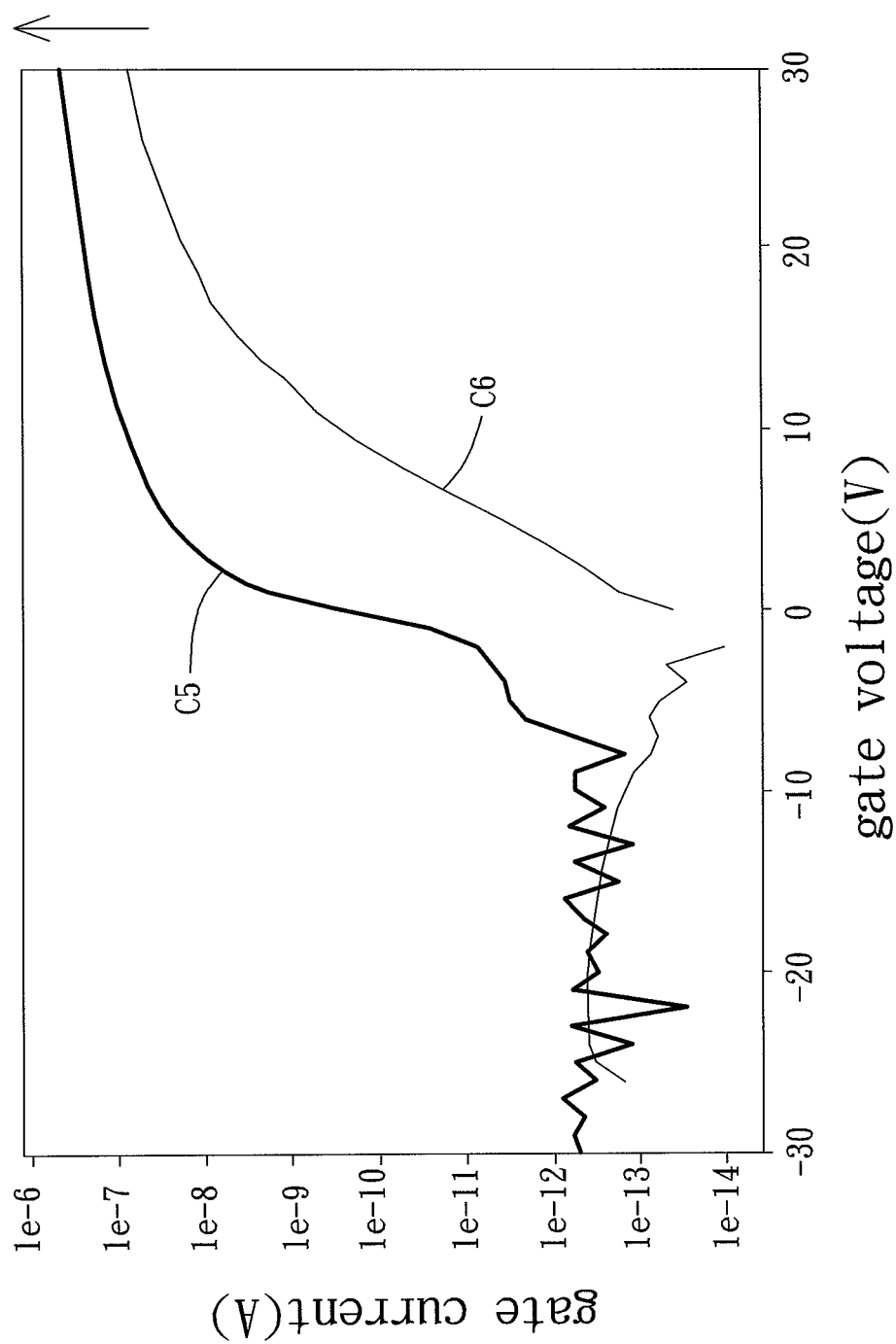
FIG. 5 is a diagram of a gate current-gate voltage curve of a thin film transistor subjected plasma treatment and a gate current-gate voltage curve of another thin film transistor not subjected to plasma treatment.

FIG. 5 is a diagram of a gate current-gate voltage curve C5 of a thin film transistor subjected plasma treatment and a gate current-gate voltage curve C6 of another thin film transistor not subjected to plasma treatment. After comparing the curve C5 with the curve C6, it can be appreciated that the gate current of the thin film transistor subjected to the plasma treatment of the method of the first embodiment according to the present invention is greatly increased, proving that the thin film transistor produced by the method of the first embodiment according to the present invention can indeed increase the conduction current of the thin film transistor.

Figure 6:
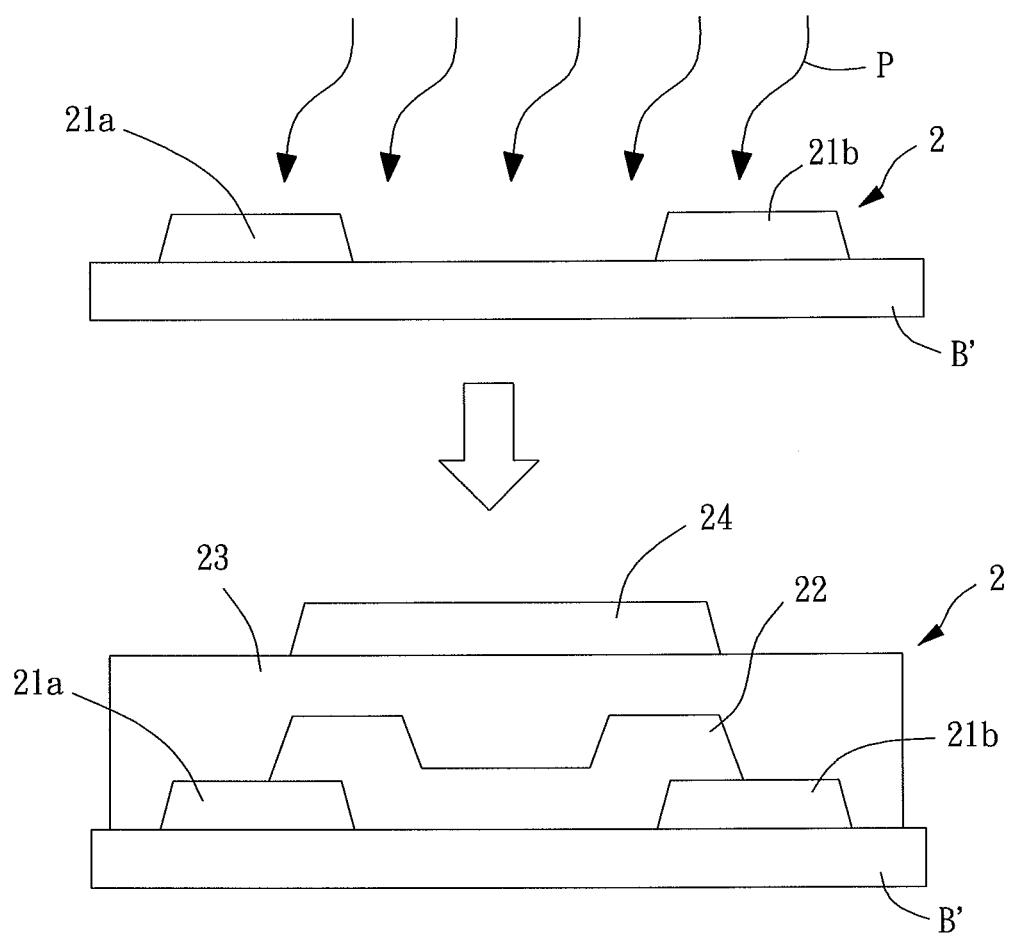
FIG. 6 is a diagrammatic view illustrating a method for producing a thin film transistor of a second embodiment according to the present invention.

FIG. 6 is a diagrammatic view illustrating a method for producing a thin film transistor of a second embodiment according to the present invention. The thin film transistor in this embodiment has a coplanar structure.

With reference to FIG. 2, in the transistor prototype preparation step S1 a transistor prototype 2 is formed on a substrate B'. The transistor prototype 2 includes two transparent electrodes 21a and 21b. The two transparent electrodes 21a and 21b are adapted to form a source and a drain of a thin film transistor. The substrate B' for forming the transistor prototype 2 in this embodiment is substantially the same as the substrate B in the first embodiment. An example of forming the transistor prototype 2 includes forming a transparent conductive film on the substrate B' by deposition to permit subsequent formation of the two transparent electrodes 21a and 21b by etching. The transparent conductive film can be made of a transparent conductive material, such as indium tin oxide (ITO). The two transparent electrodes 21a and 21b serve as the drain and the source.

Still referring to FIGS. 2 and 6, in the plasma treatment step S2 the two transparent electrodes 21a and 21b of the transistor prototype 2 are exposed in an environment full of a plasma P. The plasma P conducts a surface treatment on the two transparent electrodes 21a and 21b of the transistor prototype 2 to form the thin film transistor having a coplanar structure. In this embodiment, the transistor prototype 2 is placed in the reaction chamber (not shown), and the plasma (such as hydrogen plasma) is filled into the reaction chamber. The plasma flow rate, the plasma power, the plasma processing time, the biasing power, and the operating pressure of the plasma P are substantially identical to those in the first embodiment. Thus, the surfaces of the two transparent electrodes 21a and 21b are metalized and become more like a conductor. This reduces the contact resistance between the two transparent electrodes 21a and 21b and other material layers.

Still referring to FIGS. 2 and 6, in the product completion step S3 the thin film transistor is produced from the transistor prototype 2 that has been processed by the surface treatment with the plasma P. In this embodiment, after the surface treatment on the transistor prototype 2 by the plasma P, an active layer material is formed between the two transparent electrodes 21a and 21b by deposition. The active layer material can be zinc oxide (ZnO). Next, an active layer region 14 can be defined by the lift-off process. Then, a gate insulator 23 is formed on the two transparent electrodes 21a and 21b, the active layer region 22, and the substrate B' by deposition of an insulating material, such as silicon dioxide (SiO$_2$). Next, another transparent conductive film is formed on the gate insulator 23 to define a gate 24. Thus, a thin film transistor of a coplanar structure is finished.

Note that Schottky contact is less likely to occur at the contact surfaces between the active layer region 22 and the two transparent electrodes 21a and 21b. Furthermore, the characteristics of the contact surfaces are more like ohmic contact. Since the contact resistance between the active layer region 22 and the two transparent electrodes 21a and 21b is reduced, the conduction current of the thin film transistor can be increased to avoid the current crowding effect. Likewise, the method for producing a thin film transistor according to the present invention is suitable for producing thin film transistors of other structures, which can be appreciated by one having ordinary skill in the art.

By the above technical solutions, the main features of the method for producing a thin film transistor according to the present invention are that a transistor prototype 1, 2 is formed on a substrate B, B' and includes two transparent electrodes 13a and 13b, 21a and 21b for forming a source and a drain of a thin film transistor. Next, the two transparent electrodes 13a and 13b, 21a and 21b of the transistor prototype 1, 2 are exposed in an environment full of a plasma P that conducts a surface treatment on the two transparent electrodes 13a and 13b, 21a and 21b of the transistor prototype 1, 2 to form the thin film transistor.

Thus, by using the plasma P (such as hydrogen plasma having a plasma flow rate of 20-30 sccm, a plasma power of 500-700 W, a plasma treatment time of 20-100 seconds, a biasing power of 200-400 W, and an operating pressure of 15 mTorr) to conduct the surface treatment on the transparent electrodes 13a and 13b, 21a and 21b, the surfaces of the transparent electrodes 13a and 13b, 21a and 21b are metalized to be more like a conductor. This reduces the contact resistance between the two transparent electrodes 13a and 13b, 21a and 21b and other material layers, achieving the effects of increasing the conduction current of the thin film transistor and avoiding the current crowding effect.

Note that the surface treatment cannot provide the desired effect if the biasing power is too small. On the other hand, bombardment occurs on the surfaces of the electrodes if the biasing power is too large. The contact resistance of the transparent electrodes 13a and 13b, 21a and 21b can effectively be reduced when the biasing power is between 200 W and 400 W. Thus, the embodiments according to the present invention can indeed solve the problem of excessive contact resistance of the transparent electrodes of the conventional thin film transistors.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A method for producing a thin film transistor, comprising:
    forming a transistor prototype on a substrate, with the transistor prototype including two transparent electrodes, with the two transparent electrodes adapted to form a source and a drain of a thin film transistor; and
    metallizing the two transparent electrodes for reducing contact resistance of the two transparent electrodes by
    exposing the two transparent electrodes of the transistor prototype in an environment full of a hydrogen plasma with a biasing power of 200-400 W for 20-100 seconds, with the hydrogen plasma conducting a surface treatment on the two transparent electrodes of the transistor prototype to form the thin film transistor.

2. The method for producing a thin film transistor as claimed in claim 1, wherein the two transparent electrodes are made of indium tin oxide.

3. The method for producing a thin film transistor as claimed in claim 1, wherein an operating pressure of the hydrogen plasma is 15 mTorr.

4. The method for producing a thin film transistor as claimed in claim 1, wherein a plasma power of the hydrogen plasma is 500-700 W.

5. The method for producing a thin film transistor as claimed in claim 1, wherein a plasma flow rate of the hydrogen plasma is 20-30 sccm.

6. The method for producing a thin film transistor as claimed in claim 1, wherein forming the transistor prototype includes forming a gate on the substrate, forming a gate insulator on the gate and the substrate, and forming the two transparent electrodes on the gate insulator.

7. The method for producing a thin film transistor as claimed in claim 6, wherein an active layer region is formed between the two transparent electrodes to form the thin film transistor after the surface treatment of the two transparent electrodes of the transistor prototype.

8. The method for producing a thin film transistor as claimed in claim 7, wherein the active layer region is made of zinc oxide.

9. The method for producing a thin film transistor as claimed in claim 6, wherein the gate is made of indium tin oxide.

10. The method for producing a thin film transistor as claimed in claim 6, wherein the gate insulator is made of silicon dioxide.

11. The method for producing a thin film transistor as claimed in claim 1, wherein forming the transistor prototype includes forming the two transparent electrodes on the substrate.

12. The method for producing a thin film transistor as claimed in claim 11, wherein the thin film transistor is produced after surface treatment of the two transparent electrodes of the transistor prototype, and wherein the thin film transistor is produced by forming an active layer region between the two transparent electrodes, forming a gate insulator on the two transparent electrodes, the active layer region, and the substrate, and forming a gate on the gate insulator.

13. The method for producing a thin film transistor as claimed in claim 1, wherein the thin film transistor has a coplanar or inverted coplanar structure.

14. The method for producing a thin film transistor as claimed in claim 1, wherein the substrate is a flexible substrate, a glass substrate, a metal substrate, or a plastic substrate.

\* \* \* \* \*